United States Patent
Ohya et al.

(10) Patent No.: US 6,653,207 B2
(45) Date of Patent: Nov. 25, 2003

(54) PROCESS FOR THE PRODUCTION OF ELECTRIC PART

(75) Inventors: Kazuyuki Ohya, Tokyo (JP); Kazuhiro Otsu, Tokyo (JP); Takeshi Nobukuni, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/093,603

(22) Filed: Mar. 11, 2002

(65) Prior Publication Data

US 2002/0132447 A1 Sep. 19, 2002

(30) Foreign Application Priority Data

Mar. 13, 2001 (JP) ........................................ 2001/069684

(51) Int. Cl.⁷ ........................... H01L 21/30; H01L 21/46
(52) U.S. Cl. ..................... 438/458; 438/459; 438/977
(58) Field of Search ................................. 438/455, 458, 438/FOR 485, FOR 106, FOR 477, 459, 977; 148/DIG. 12

(56) References Cited

U.S. PATENT DOCUMENTS 5,374,582 A * 12/1994 Okonogi et al. ............ 438/419
6,323,108 B1 * 11/2001 Kub et al. ................... 438/458
6,362,075 B1 * 3/2002 Czagas et al. ............... 438/455
6,429,094 B1 * 8/2002 Maleville et al. ........... 438/455

\* cited by examiner

Primary Examiner—Olik Chaudhuri
Assistant Examiner—Khiem Nguyen
(74) Attorney, Agent, or Firm—Wenderoth, Lind & Ponack, L.L.P.

(57) ABSTRACT

A process for the production of an electric part, comprising performing a circuit-parts-forming step including the introduction of impurities on one surface (surface A) of a semiconductor substrate, then bonding the surface A to a holding substrate, performing a back surface treatment step essentially including a polishing of an exposed surface (surface B) of the semiconductor substrate to a thickness of 100 $\mu$m or less to obtain an electric-part-formed thinned substrate and separating the thinned substrate from the holding substrate, wherein a resin composition containing a swelling inorganic compound (WC) is used for an adhesion layer and in the separating step the thinned substrate is separated from the holding substrate after decreasing the adhesive strength of the thinned substrate and the holding substrate by swelling the swelling inorganic compound (WC).

4 Claims, No Drawings

US 6,653,207 B2

PROCESS FOR THE PRODUCTION OF ELECTRIC PART

FIELD OF THE INVENTION

The present invention relates to a process for the production of a thinned electric part. Specifically, the process is characterized in that a resin composition containing a swelling inorganic compound (WC) is used for part or the whole of an adhesion layer and a separation is promoted due to a decrease or loss in the adhesive strength of the adhesion layer by making the swelling inorganic compound (WC) absorb a liquid after the completion of a treatment step of a back surface. In particular, the process enables a separation in cases where the separation is extremely difficult, such as a case in which an adhesive strength is strengthened by a treatment step such as a treatment step essentially requiring a high temperature step.

BACKGROUND OF THE INVENTION

In recent years, electronic devices have been desired to be decreased in thickness or in weight. As is typified by a portable telephone or an IC card, electric devices are decreasing in thickness. From the viewpoint of a speed-up or a decrease in electric power consumption, it is required to decrease the thickness of a semiconductor.

When electric circuits are formed on only one surface of a semiconductor wafer, a ceramic substrate and etc. (to be generically referred to as "substrate" hereinafter) which have been already thinned, warps or distortions occur due to a thermal expansion coefficient difference of approximately $5 \sim 15 \times 10^{-6} K^{-1}$ between a material for the formation of circuits, particularly a metal such as aluminum, copper or gold, and the silicon wafer or the ceramic substrate. Due to the occurrence of warps or distortions, it becomes impossible to form circuits on its back surface and furthermore it becomes also impossible to carry out even all steps of the front surface in some cases. For this reason, it is substantially impossible to use a substrate which has been already thinned.

Thus, conventionally, when electric circuits are formed on only one surface, there is adopted a method in which an electric-circuits-forming step essentially requiring a high temperature is performed mainly on one surface (front surface) of a substrate having a thickness, generally at least 200 μm, sufficient for retaining the shape thereof, then the front surface is bonded to a holding substrate to protect the front surface, and the opposite surface (back surface) is polished to thin the substrate.

Conventionally, as a thinning method, there is proposed a fixation method with a wax or a tape.

As a fixation method using a wax, there is proposed a method in which a wax is applied on a dummy wafer (holding substrate) under heat, a wafer is bonded to the dummy wafer, the wafer is ground and further polished and then the wafer is separated from the dummy wafer by melting the wax under heat and slipping the wafer sideways or by cooling the wax and breaking the wax which has become fragile by means of an impact breakdown. However, the wax fixation has problems about thickness accuracy, parallelism and flatness.

As a tape fixation method, there is a method in which a back-grinding tape is affixed to a front surface of a substrate and an opposite surface is polished to thin the substrate.

When it is required to form a metal thin layer on the back surface of a thinned wafer or a thinned substrate, generally, there is required a high-temperature treatment step at a temperature of from 250 to 450° C. for from 30 minutes to 1 hour, which high-temperature treatment includes, for example, a pretreatment with fluoric acid, nitric acid or the like, a metal deposition such as aluminum or gold, and a calcination treatment thereof.

However, it is impossible to carry out these steps under the state where a substrate is bonded to a holding substrate with a wax or a back-grinding tape. In the method using a wax or a tape for thinning, after a substrate is thinned, it is separated from a holding substrate and then subjected to a high-temperature treatment step. The thinned substrate is very fragile. And, since semiconductor circuits different in thermal expansion coefficient from the substrate exist on one surface of the thinned substrate, a defective fraction considerably increases because of distortion or breakage. Further, when the thickness is thin or approximately 50 μm, it is difficult to subject the thinned substrate to a high-temperature treatment step.

If electric circuits can be efficiently formed on a thinned substrate having a large work size, electric parts having a decreased thickness, a high speed and a decreased electric power consumption can be practically produced.

Thus, the present inventors have proposed a method in which a substrate is bonded to a holding substrate, the substrate is thinned, the thinned substrate bonded to the holding substrate is subjected to a high temperature treatment step or other steps as it is and, after the completion of these steps, the substrate is separated from the holding substrate by using water or the like (JP-A-2001-77304, Japanese Patent Application Nos. 2001-30746, 2000-401077, 2000-401078, etc.).

However, in the above method, when a treatment step at more than 400° C. is present, the separation is substantially impossible.

Further, even when no high temperature treatment step is present, depending on a surface-treatment method of a substrate, it is very difficult in some cases to find a resin composition for bonding which has an adhesion reliability sufficient for enduring a processing step of a back surface and allows an easy separation after the completion of the step.

SUMMARY OF THE INVENTION

It is an object of the present invention to provide a resin composition for bonding which can be easily decreased in adhesive strength by a simple means even when an adhesion is strengthened by a high-temperature treatment step or even when it is difficult to find an easily-separable resin composition for bonding, and provide its use.

According to the present invention, there is provided a process for the production of an electric part, comprising performing a circuit-parts-forming step including the introduction of impurities on one surface (surface A) of a semiconductor substrate, then bonding the surface A to a holding substrate, performing a back surface treatment step essentially including a polishing of an exposed surface (surface B) of the semiconductor substrate to a thickness of 100 μm or less to obtain an electric-part-formed thinned substrate and separating the thinned substrate from the holding substrate, wherein a resin composition containing a swelling inorganic compound (WC) is used for an adhesion layer and in the separating step the thinned substrate is separated from the holding substrate after decreasing the adhesive strength of the thinned substrate and the holding substrate by swelling the swelling inorganic compound (WC).

Further, in the process provided according to the present invention, preferably, the swelling inorganic compound (WC) is a fine powder having an average particle diameter of from 0.05 to 3 $\mu$m.

Further, in the process provided according to the present invention, preferably, the swelling inorganic compound (WC) contains substantially no particles having a particle diameter of 10 $\mu$m or more.

Further, in the process provided according to the present invention, preferably, the swelling inorganic compound (WC) is a swelling clay mineral, a swelling phyllosilicate or a swelling carbon.

Further, in the process provided according to the present invention, preferably, the content of the swelling inorganic compound (WC) in the resin composition is 1 to 30% by weight.

DETAILED DESCRIPTION OF THE INVENTION

The constitution of the present invention will be explained hereinafter.

The present invention is characterized in that a resin composition containing a swelling inorganic compound (WC) is used in an adhesive layer.

The swelling inorganic compound (WC) is an inorganic compound which gets swollen by absorbing water, an organic solvent, steams of these, etc. Generally, the above inorganic compound has a layered crystal structure and has a hydrophilic or lipophilic element or a hydrophilic or lipophilic group in the interlayer, and the interlayer adsorbs water or an organic solvent molecule to broaden an interlayer distance or cause a delamination in some cases. The swelling inorganic compound (WC) includes a water-swelling clay mineral, a swelling phyllosilicate or a swelling carbon.

The water-swelling clay mineral includes sepiolite, palygorskite, vermiculite, bentonite, sericite clay, etc.

The swelling phyllosilicate includes a natural product and a synthetic product. The natural swelling phyllosilicate includes natural bentonite, natural hectorite, natural saponite, natural stevensite, natural beidellite, natural montmorillonite, natural nontronite, etc.

The synthetic swelling phyllosilicate includes a synthetic smectite, a synthetic hectorite, a synthetic swelling mica, etc.

The synthetic smectite includes synthetic products of hectorite, saponite, iron saponite, stevensite, beidellite, montmorillonite, nontronite, etc.

The synthetic swelling mica includes a Li type taeniolite, a Na type taeniolite, a Na type hectorite, a Na type tetrasilicic mica, a Li type tetrasilicic mica, a synthetic swelling fluorinated mica, a Na type fluorinated tetrasilicic mica, etc.

The swelling carbon includes swelling graphite, etc.

Commercially available products of the swelling inorganic compound (WC) include Somacigh (product No.; ME-100, supplied by Co-op chemical Co., Ltd., synthetic swelling mica), Rucentite (product Nos.; SWN, SWF, SHS, supplied by Co-op chemical Co., Ltd., synthetic smectite), Dymonite (supplied by Topy Industries, Ltd., synthetic swelling mica), Sgmeton SA-1(supplied by Kunimine Industries Co., Ltd., saponite allied substance), Kunipia F (supplied by Kunimine Industries Co., Ltd., natural montmorillonite),Bengel (supplied by HojunYoko K.K., natural montmorillonite), Beegahm (supplied by Vanderbilt (USA), natural hectorite), Laponite XLG (supplied by Laporte Industries Ltd (UK), natural hectorite allied substance), Laponite RD (supplied by Laporte Industries Ltd(UK), synthetic hectorite allied substance), and Thermobis (supplied by Henkel (Germany), synthetic hectorite allied substance).

A synthetic smectite imparted with an organic solvent-swelling property, i.e., lipophilic property includes Rucentite (SAW, SAF, STN, SPN; type of being swollen with a toluene or xylene solvent, supplied by Co-op chemical Co., Ltd., organic synthetic smectite) and Rucentite (SEN, STN, SPN, DMF; type of being swollen with a pyrolidone solvent, supplied by Co-op chemical Co., Ltd.).

While the average particle diameter of the swelling inorganic compound (WC) is generally 0.01 to 10 $\mu$m, the average particle diameter is preferably 0.05 to 3 $\mu$m and it is more preferred that the swelling inorganic compound (WC) has no particles having a diameter of 10 $\mu$m or more. A bonding surface is a semiconductor-circuit-formed surface and the adhesion layer must has a uniform thickness and be homogeneous. Therefore, the existence of particles having a large particle diameter is undesirable, since it inhibits a homogenous adhesion. Further, the swelling inorganic compound (WC) preferably has high compatibility with a resin in view of forming a more homogenous stable layer in the preparation of a film for adhesion or the formation of an adhesion layer by a spin coating or the like. Thus, it is preferred to adopt a method in which the swelling inorganic compound (WC) is surface-treated with a surface-treating agent or a method in which a surface-treating agent is added into a resin to be incorporated in advance or at the time of preparing a composition, as required. As a surface-treating agent used therefor, there is used a silane surface-treating agent, a titanium surface-treating agent or an aluminum surface-treating agent.

The resin composition of the present invention containing the above swelling inorganic compound (WC) is used as a beforehand-produced film or a multilayered film having a layer of the above resin composition on at least one surface thereof. Otherwise, a resin solution thereof is applied on a holding substrate by a spin coating method or other methods to form an adhesion layer on the holding substrate.

The resin used for the resin composition of the present invention must be mixable with the swelling inorganic compound (WC). Examples thereof include a liquid resin, a resin able to used as a resin solution, or a thermoplastic resin.

The thermoplastic resin includes a thermoplastic polyimide, polyetherimide, polyamide imide, polyether ketone, polyether ether ketone, polybenzoimidazole, polyamide, polyvinyl alcohol, polystyrene, triacetylcellulose, poly-4-methylpentene, an ethylene-vinylalcohol copolymer, polymethyl methacrylate, a fluorine tetrafluoroethylene-fluoroalkylvinylether copolymer (PFA), polyvinylidene fluoride (PVDF), a tetrafluoroethylene-hexafluoropropylene copolymer (FEP), polychlorotrifluoroethylene (PCTFE) and a chlorotrifluoroethylene-ethylene copolymer (E/CTFE).

Further, a resin solution used for forming a heat-resistant adhesion layer includes solutions of polyimide acid of a polyimide precursor in dimethylformamide (DMF), dimethylacetamide (DMAC) or N-methyl-2-pyrolidone. In addition to these, various thermoplastic resins can be used as a solvent solution thereof. Example thereof includes a solution of a thermoplastic polyamide resin (crystalline nylon) in formic acid, mineral acid, phenols or fluoroalcohol; a solution of 6/6-6 nylon or 6/6-10 nylon in heated methanol; a solution of polyvinyl alcohol or an ethylene-vinyl alcohol copolymer in alcohols; a solution of polystyrene or methyl methacrylate in a ketone or an aromatic hydrocarbon; and a solution of a polycarbonate resin or a polyphenyleneether resin in a hologenated hydrocarbon solvent.

The adhesion layer of the present invention is formed from the above components.

The adhesion layer is used as a beforehand-prepared film, a coating film or an adhesion auxiliary layer formed on a film.

First, examples of the method using as a coating film includes the following methods. In a first method, a swelling inorganic fine powder such as a synthetic smectite fine powder is incorporated into a resin solution such as a polyimide resin solution. The mixture is defoamed or mixed under a reduced pressure to obtain a coating composition having physical properties, particularly a viscosity, suitable for a means to be adopted. Then, the coating composition is applied on a holding substrate by a spin coating, a bar coating, a roll coating or a silk screen printing, dried and polymerized by heating. In a second method, coating layers same or different in kind are formed both on a substrate and on a holding substrate respectively and the coating layers are integrated at a bonding time to form an adhesive layer. In a third method, a layer of the above coating composition is formed on either a substrate or a holding substrate which is a predetermined separation side and a commercially available film is stacked on the above layer.

The method using as a beforehand-prepared film is typified by a method using a solventless mixture in which a swelling inorganic fine powder such as a synthetic smectite fine powder is mixed with, for example, a thermoplastic polyamide resin with a kneading machine and the kneaded mixture is extruded and then oriented as required to form a film. Further, there may be adopted a method in which a coating film is formed on a substrate to be separated by the same method as the above method of directly forming an adhesion layer and the coating film is separated and then used as an adhesion film.

Further, the above method includes a method in which film(s) of the above-mentioned coating composition is formed on one surface or both surfaces of a commercially available film to form a laminate film.

Further, as another method, there can be devised a method in which a holding substrate is held in a metallic mold and an adhesive layer is formed on its one surface by a press molding, an injection molding or the like.

Next, while the holding substrate of the present invention is selected depending on the condition of a back surface treatment step as required, the holding substrate of the present invention is needed to have high heat resistance and high chemical resistance. Further, it is needed for decreasing a warp after the bonding that the holding substrate has a coefficient of thermal expansion near to that of a substrate.

Generally, examples of the holding substrate includes inorganic compound-based materials such as aluminum nitride, silicon carbide, silicon nitride, sapphire, alumina, zirconia, wollastonite, amorphous carbon, glassy carbon and a C/C composite with silicon carbide. A silicon wafer can be also used.

Further, there are preferably used those which obtained by impregnating an inorganic continuously porous sintered body having preferably 2 to 35 vol % of continuous pores having an average pore diameter of 0.1 to 10 μm with a heat resistant resin and curing the impregnated resin. The inorganic continuously porous sintered body includes aluminum nitride-boron nitride(AlN-h-BN), silicon carbide(SiC), aluminum nitride-silicon carbide-boron nitride (AlN—SiC-h-BN), alumina-boron nitride ($Al_2O_3$-h-BN) and silicon nitride-boron nitride ($Si_3N_4$-h-BN), zirconium oxide-alumina-boron nitride ($ZrO_3$—$Al_2O_3$-h-BN), alumina-titanium oxide-boron nitride ($Al_2O_3$—TiO-h-BN) and amorphous carbon. In particular, inorganic continuously porous sintered bodies disclosed in JP-A-2000-344587 are preferably used.

For improving the adhesion of a bonding surface, the holding substrate preferably has a surface roughness Ra of from 0.1 to 5 μm. When the adhesion of the bonding surface to an adhesion layer becomes worse, a separation occurs between the holding substrate and the adhesion layer at a separation time instead of a separation between the substrate and the adhesion layer. In this case, if no contrivance is given to a holding means of the substrate after the separation, undesirably, a warp or a breakage in some cases occurs. When the surface roughness Ra is larger than 5 μm, the adhesion layer can not absorb the roughness to cause a wrinkle of the adhesion layer or a breakage of the substrate in some cases. Further, the surface of a substrate to be used should avoid having a surface roughness of more than 5 μm. When such a roughness is essentially required, it is preferred to use a substrate of which the surface is smoothed by forming a protection layer for covering the roughness.

Further, a surface treatment is carried out for improving adhesive property. As a method therefor, the indispensable preliminary treatment for a resin impregnation, described in the above-mentioned JP-A-2000-344587, is the most preferable. In the above treatment, one kind or at least two kinds of organic metal compound(s) (M) is impregnated so as to arrive at the surfaces of pores of the holding substrate, air-dried, preliminarily reacted, dried under heat and further pyrolyzed at a maximum temperature of 850° C. or less.

As a method for separating the thinned substrate of the present invention from the holding substrate, there can be adopted methods disclosed in Japanese Patent Application Nos. 2000-194077, 2001-30746, 2000-401077, 2000-401078, etc. Further, when a lipophilic swelling inorganic compound (WC) is used for the bonding, there can be adopted a method in which an appropriate organic solvent is selected and used for promoting the separation.

Furthermore, there can be adopted, as required, a method in which after cutting to respective chip sizes, a separation is promoted to separate the thinned substrate from the holding substrate and a method in which the adhesion layer-attached substrate is separated from the holding substrate with the thinned substrate being held by adsorption and then the adhesion layer is separated by further carrying out a separation-promoting treatment.

The state of a semiconductor circuit formed on a bonding surface (front surface), for example an aluminum metal corrosion by an aluminum metal exposure, limits the selection of a separation-promoting method in some cases. In such cases, a separation promotion using an organic solvent is selected.

EXAMPLES

The present invention will be explained concretely with reference to Examples.

Example 1

A disk of an aluminum nitride-boron nitride continuous porous sintered body which disk had a thickness of 0.625 mm and a diameter of 150.5 mm was surface-treated by the impregnation and pyrolysis of an aluminum compound, the surface-treated disk was impregnated with a ladder silicon resin, the impregnated-resin was cured and the surface of the resin-cured disk was polished to prepare a holding substrate (to be referred to as "AN-1" hereinafter) having a surface roughness Ra of 0.3 µm, a parallelism of 2 µm and a flatness of 2 µm.

There was prepared, as a semiconductor substrate, a silicon wafer having a thickness of 0.625 mm and a diameter of 150.0 mm and having a nitride film attached to one surface thereof.

97 parts by weight of a thermoplastic polyimide resin (trade name: Rikacoat PA-20, solid content 20 wt %, solvent N,N-dimethyl acetamide (DMAC), supplied by New Japan Chemical Co., Ltd) formed of 3,3',4,4'-diphenylsulfone tetracarboxylic acid dianhydride and aromatic diamine was sufficiently mixed with 3% by weight of a synthetic smectite fine powder (supplied by Co-op chemical Co., Ltd., trade name; Rucentite SWN) with a vacuum centrifugal mixer (model number; ARV-200, supplied by thinky K.K.) to prepare a slurry solution (to be referred to as "PI-SWN" hereinafter).

The PI-SWN was applied onto the holding substrate with a film coater (supplied by Tester Sangyo Co., Ltd., model number; PI-1210) and naturally dried for a whole day and night. Then, the holding substrate was dried at 120° C. for 30 minutes and at 200° C. for 1 hour. The obtained coating layer had a thickness of 25 µm.

Right before its use, the above-obtained imide-coating holding substrate was aged under a nitrogen gas atmosphere having an oxygen concentration of 1 ppm or less in a high-temperature inert oven at 350° C. for 1 hour and at 400° C. for 2 hours, the holding substrate was cooled to obtain a heat-resistant-adhesive-attached holding substrate, and the silicon wafer (thickness 625 µm, diameter 150 mm) was placed on the above adhesive layer such that the nitride film surface of the silicon wafer faced to the bonding surface side, whereby an adhesion set was constructed.

A 0.4 mm-thick aluminum alloy plate, a cushion of a carbon fiber cloth (trade name: BESFIGHT PAPER BP-1050A-EP, supplied by TOHO TENAX CO., LTD.) sealed with a polyimide film under reduced pressure, and a 0.4 mm-thick aluminum alloy plate were piled up in this order to prepare a laminated assistant board.

Further, there was prepared, as a positional aberration-prevention frame, a 0.6 mm-thick aluminum alloy plate having a hole having a diameter of 150.6 mm in its central portion.

The above-prepared laminated assistant board, the adhesion set+the positional aberration-prevention frame, and the laminated assistant board were disposed in this order between hot plates of an air plunger pressurization type vacuum press.

The press atmosphere was reduced to a reduced pressure of 1 kPa or lower, then a pressing was carried out at a surface pressure of 0.1 MPa, the temperature was increased up to 330° C. at a rate of 10° C./minute, the above materials between the hot plates were maintained at 330° C. for 15 minutes, the pressure was opened to atmosphere, and the materials were allowed to cool, whereby the silicon wafer was bonded to the holding substrate.

The holding substrate side of the bonded wafer/holding substrate was mounted on an adsorption board of a horizontal precision surface grinding machine (supplied by Okamoto Machine Tool Works, Ltd, machine name: GRIND-X SRG-200, each revolution number 300 rpm). Then the wafer/holding substrate was ground using a diamond grinding wheel No. 320 at a processing rate of 20 µm/minute until the thickness of the wafer became 90 µm. Then, it was ground using a diamond grinding wheel No. 2,000 until the thickness of the wafer became 82 µm. Finally, the wafer/holding substrate was chemically mechanically polished with a CMP machine (supplied by Okamoto Machine Tool Works, Ltd, machine name: GRIND-X, SPL15T, number of revolutions: 35 rpm, load: 7.0 kg) using colloidal silica, to obtain a thinned wafer/holding substrate having a thickness of 80 µm and a surface roughness Ra of 0.02 µm.

The thinned wafer surface was washed with a 5% hydrofluoric acid aqueous solution at 25° C. for 20 minutes, then washed by spraying pure water at 25° C. for 1 minute and dried with hot air at 120° C. for 3 minutes and then at 150° C. for 10 minutes.

The thinned wafer/holding substrate was maintained under a nitrogen gas atmosphere having an oxygen concentration of 1 ppm or lower in a high-temperature inert oven set at a temperature of 450° C. for 30 minutes. The oven was cooled at a rate of 2° C./minute. The thinned wafer/holding substrate was taken out from the oven at 50° C. The thinned wafer/holding substrate was allowed to cool to room temperature.

No warp was observed in the oven.

Further, the thinned wafer/holding substrate was checked for warps on a surface plate, to find no warps. Further, no separation was found between the thinned silicon wafer and the holding substrate. However, it was observed that the adhesive resin at an end portion was slightly molten.

The 80 µm-thick thinned wafer/holding substrate was set in a holder in a quartz container filled with pure water having 80° C. and immersed in the pure water for 30 minutes to allow the adhesion layer to absorb the water, whereby the synthetic smectite was swollen.

The silicon wafer of the silicon wafer-bonded holding substrate was bonded to a UV peeling type adhesive tape for dicing (supplied by LINTEC Corporation, to be referred to as "UV tape" hereinafter) bonded to a dicing saw fixture (Teflon-coated and made of stainless steel). Both surfaces thereof were adsorbed to vacuum chuck boards and then pulled apart by a force of approximately 150 N. The silicon wafer was separated from the adhesion layer-attached holding substrate with the silicon wafer being bonded to the UV tape.

Further, the holding substrate can be re-used by forcibly separating the adhesive layer bonded thereto, washing the resultant holding substrate and drying it.

Example 2

The same holding substrate AN-1 as that in Example 1 was used. A groove portion having a width of 5.0 mm and a depth of 20 µm was made in the holding substrate in a position corresponding to the orientation-flat portion of a semiconductor substrate to be bonded with a #800 diamond grinding wheel. Then, PI-SWF was applied to the groove portion and dried under heat and then the thickness was measured. The thickness was 30 µm. The PI-SWF was a slurry solution which was obtained in the same manner as in Example 1 except that the Rucentite SWN was replaced with Rucentite SWF. Thus, the above portion was ground with a #800 sandpaper to carry out a bonding surface adjustment.

A thermoplastic polyimide film (trade name: UPIREX VT441S, supplied by UBE INDUSTRIES. Ltd.) having a thickness of 25 μm and a diameter of 150.3 mm was placed on the above holding substrate and a silicon wafer having a thickness of 625 μm and a diameter of 150 mm was placed thereon such that its nitride film surface faced to the bonding surface.

Thereafter, bonding, thinning by grinding and CMP, and a high-temperature inert oven treatment at 450° C. under a nitrogen atmosphere were carried out in the same manner as in Example 1. The resultant thinned wafer/holding substrate was checked for warps on a surface plate, to find no warps.

The above-obtained 80 μm-thick thinned wafer/holding substrate was set in a holder in a quartz container filled with pure water having 80° C. and immersed in the pure water for 60 minutes to swell the synthetic smectite. The thermoplastic polyimide film at the swollen synthetic smectite portion side of the 80 μm-thick thinned wafer/holding substrate was lightly pressed with a cutter knife edge. Then, both surfaces thereof were adsorbed to vacuum chuck boards respectively and then pulled apart by a force of approximately 150 N. The thinned silicon wafer was separated from the adhesion layer-attached holding substrate.

Further, the holding substrate can be re-used by forcibly separating the adhesive layer bonded thereto, washing the resultant holding substrate and drying it.

Example 3

A disk of an alumina-boron nitride continuous porous sintered body which disk had a thickness of 0.625 mm and a diameter of 125.0 mm was surface-treated by the impregnation and pyrolysis of an aluminum compound, the surface-treated disk was impregnated with a ladder silicon resin, the impregnated-resin was cured and the surface of the resin-cured disk was polished to obtain a holding substrate (to be referred to as "AL-1" hereinafter) having a surface roughness Ra of 0.4 μm a parallelism of 2 μm and a flatness of 2 μm.

There was prepared, as a semiconductor substrate, a gallium-arsenic wafer (to be referred to as "GAAS" hereinafter) having a thickness of 0.625 mm and a diameter of 100.0 mm.

A synthetic smectite fine powder (supplied by Coop chemical Co., Ltd., trade name; Rucentite SWN) was mixed with an isopropyl alcohol (IPA) solution having a 2-n-butoxycarbonylbenzoyloxy-tributoxytitanium (trade name: Titacost S-181, supplied by NIPPON SODA CO., LTD.) concentration of 3% by weight for 30 minutes. Then, the IPA solution was removed and the resultant substance was air-dried for a whole day and night and then dried with a dryer at 120° C. for 30 minutes to obtain a surface-treated synthetic smectite fine powder (to be referred to as "SWN-S" hereinafter).

90 parts by weight of polystyrene, 10 parts by weight of the SWN-S powder were placed in a kneader set at a temperature of 180° C. and the mixture was melted and kneaded for about 15 minutes. Then, the kneaded mixture was extruded with a T-die extruder (extrusion temperature 200° C.) and oriented by 1.5 times at an orienting temperature of 130° C., to obtain a smectite-containing polystyrene film (to be referred to as "FPS-S" hereinafter) having a thickness of 50 μm.

An aluminum plate, a silicon cushion (trade name: HT1500 RED, supplied by Rogers (USA)) and an aluminum plate were piled up in this order to obtain a laminated assistant board.

The holding substrate AL-1, the clipped FPS-S film having a disk form having a diameter of 100.3 mm, and the gallium-arsenic wafer GAAS were stacked such that the nitride film surface of the gallium-arsenic wafer GAAS faced inside, whereby an adhesion set was prepared.

A hole having a depth of 0.60 mm and a diameter of 125.3 mm was made in an aluminum alloy plate having a thickness of 1.2 mm. A concentric through hole having the same center as that of the above hole and a diameter of 100.3 mm was made inside the above hole, to prepare a positional aberration-prevention frame.

The laminated assistant board, the adhesion set+the positional aberration-prevention frame, and the laminated assistant board were placed in this order between hot plates of an air plunger pressurization type vacuum press. An input aperture was closed. The atmosphere in the vacuum press was reduced to 1 kPa or lower, a pressing was carried out at a surface pressure of 0.1 MPa, the temperature was increased up to 120° C. at a rate of 10° C./minute, the above materials between the hot plates were maintained at 120° C. for 20 minutes, the pressure was opened to atmosphere, and the materials were allowed to cool, whereby the GAAS was bonded to the holding substrate.

The holding substrate side of the bonded GAAS/holding substrate was mounted on an adsorption board of a precision surface grinding machine (each revolution number 300 rpm). The GAAS surface was ground using a diamond grinding wheel #380 at a processing rate of 20 μm/minute until the thickness of the wafer became 70 μm. Then, it was ground using a diamond grinding wheel #1200 until the thickness of the GAAS became 51 μm. Then, the GAAS surface was chemically mechanically polished with a CMP machine using colloidal silica, to obtain a thinned GAAS/holding substrate having a thickness of 50 μm and a surface roughness Ra of 0.03 μm.

The CMP surface of the thinned GAAS was surface-treated by spraying a 5% hydrofluoric acid aqueous solution at 25° C. for 20 minutes, then washed by spraying pure water at 25° C. for 1 minute and dried with hot air at 120° C. for 3 minutes and then at 150° C. for 10 minutes.

The thinned GAAS/holding substrate was placed in a muffle furnace set at a temperature of 320° C. for 15 minutes. The thinned GAAS/holding substrate was taken out from the furnace. The thinned GAAS/holding substrate was allowed to cool to room temperature. The thinned GAAS/holding substrate was checked by observation during the maintenance thereof in the muffle furnace, to find no warps. Further, after the cooling to room temperature, the thinned GAAS/holding substrate was checked for warps on a surface plate, to find no warps. Further, the bonding surface of the thinned GAAS/holding substrate was observed, to find no separation.

The thinned GAAS/holding substrate was disposed in a dicing machine (supplied by Disco Corporation, Model DAD360) such that the holding substrate was a lower side, and the position adjustment of the thinned GAAS was carried out. Then, the thinned GAAS was cut with a diamond thin film blade (supplied by Disco Corporation, blade thickness 20 μm, grain size #3000, 2~4 μm) to obtain gridiron squares having a size corresponding to a chip size of 3.0 mm×4.0 mm each. The depth of the cutting was adjusted to the middle of the adhesion layer such that the thinned GAAS was cut but the holding substrate was not cut at all.

The cut thinned GAAS/holding substrate was immersed in pure water having a temperature of 80° C. for 30 minutes. The bonding surface was observed but almost no water penetration was found. The thinned GAAS was not at all separated under this state. However, when a twisting stress was applied to each chip of the thinned GAAS with a vacuum forceps, the chip was easily separated between the chip and the FPS-S film. The chips could be detached without any breakage.

Further, the holding substrate can be re-used by forcibly separating the adhesive layer bonded thereto, washing the resultant holding substrate and drying it.

Example 4

The same AL-1 as that in Example 3 was prepared as a holding substrate. The same GAAS as that in Example 3 was prepared as a semiconductor substrate.

A synthetic smectite-containing thermoplastic polyimide resin slurry solution (to be referred to as "PI-STN" hereinafter) was prepared in the same manner as in the preparation of the PI-SWN in Example 1 except that the Rucentite SWN was replaced with a synthetic smectite fine powder (supplied by Co-op chemical Co., Ltd., trade name: Rucentite STN).

The PI-STN was applied onto the holding substrate with a film coater (PI-1210) and naturally dried for a whole day and night. Then, the holding substrate was dried at 120° C. for 30 minutes and at 200° C. for 1 hour. The obtained coating layer had a thickness of 25 $\mu$m.

The preparation of a bonded GAAS/holding substrate, the preparation of a thinned GAAS/holding substrate and the back surface processing test of a semiconductor were carried out in the same manner as in Example 3 except for the above changes.

Then, the thinned GAAS/holding substrate was disposed in a dicing machine (supplied by Disco Corporation, Model DAD360) such that the holding substrate was a lower side, and the position adjustment of the thinned GAAS was carried out. Then, the thinned GAAS was cut with a diamond thin film blade (supplied by Disco Corporation, blade thickness 20 $\mu$m, grain size #3000, 2~4 $\mu$m) to obtain gridiron squares having a size corresponding to a chip size of 3.0 mm×4.0 mm each.

The incisions-formed thinned GAAS/holding substrate was immersed in xylene for 60 minutes. By this immersion, partially floating was found. Each chip could be easily detached.

Example 5

A disk of a silica-alumina-zirconia porous sintered body (trade name: Risalite SM-3, supplied by NICHIAS Corporation) which disk had a board thickness of 0.725 mm and a diameter of 201.0 mm was surface-treated by the impregnation and pyrolysis of an aluminum compound, the surface-treated disk was impregnated with a ladder silicon resin, the impregnated-resin was cured and the surface of the resin-cured disk was polished to obtain a holding substrate (to be referred to as "RS-1" hereinafter) having a surface roughness Ra of 0.4 $\mu$m, a parallelism of 2 $\mu$m and a flatness of 2 $\mu$m. There was prepared as a semiconductor substrate a silicon wafer (to be referred to as "SI20" hereinafter) having a thickness of 0.725 mm and a diameter of 200.0 mm. Further, the same PI-SWN as that in Example 1 was applied on the holding substrate RS-1 and dried to prepare a holding substrate having a 25 $\mu$m-thick adhesion layer.

Example 1 was repeated except that the above materials were used. It was found that a similar good preparation was possible even when the 8 inch-size silicon wafer was used.

EFFECT OF THE INVENTION

In a process for the production of an electric part, comprising performing a circuit-parts-forming step including the introduction of impurities on one surface (surface A) of a semiconductor substrate, then bonding the surface A to a holding substrate, performing a back surface treatment step essentially including a polishing of an exposed surface (surface B) of the semiconductor substrate to a thickness of 100 $\mu$m or less to obtain an electric-part-formed thinned substrate and separating the thinned substrate from the holding substrate, a separation of the semiconductor substrate from the holding substrate has been possible by manual work but its mechanization essential for industrialization have been difficult. According to the process of the production of an electric part, provided by the present invention, the semiconductor substrate can be easily mechanically separated from the holding substrate. Therefore, the production process of an electric part, provided by the present invention, has great significance industrially.

What is claimed is:

1. A process for the production of an electric part, comprising performing a circuit-parts-forming step including the introduction of impurities on one surface(surface A) of a semiconductor substrate, then bonding the surface A to a holding substrate, performing a back surface treatment step essentially including a polishing of an exposed surface (surface B) of the semiconductor substrate to a thickness of 100 $\mu$m or less to obtain an electric-part-formed thinned substrate and separating the thinned substrate from the holding substrate, wherein a resin composition containing a swelling inorganic compound (WC) is used for an adhesion layer and in the separating step the thinned substrate is separated from the holding substrate after decreasing the adhesive strength of the thinned substrate and the holding substrate by swelling the swelling inorganic compound (WC), wherein the swelling inorganic compound (WC) is a swelling clay mineral, a swelling phyllosilicate or a swelling carbon, and said swelling inorganic compound (WC) being swollen by absorbing water, an organic solvent, or steams thereof.

2. A process according to claim 1, wherein the swelling inorganic compound (WC) is a fine powder having an average particle diameter of from 0.05 to 3 $\mu$m.

3. A process according to claim 1, wherein the swelling inorganic compound (WC) substantially contains no particles having a particle diameter of 10 $\mu$m or more.

4. A process according to claim 1, wherein the content of the swelling inorganic compound (WC) in the resin composition is 1 to 30% by weight.

* * * * *